United States Patent
Park et al.

(10) Patent No.: US 8,574,367 B2
(45) Date of Patent: Nov. 5, 2013

(54) EVAPORATION SOURCE

(75) Inventors: Seuk Hwan Park, Yongin-si (KR);
Kyung Hoon Chung, Yongin-si (KR);
Yoon Sang Kwon, Yongin-si (KR);
Kyong Tae Yu, Yongin-si (KR); Hyung Min Kim, Yongin-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 1537 days.

(21) Appl. No.: 11/723,707

(22) Filed: Mar. 21, 2007

(65) Prior Publication Data
US 2007/0283890 A1  Dec. 13, 2007

(30) Foreign Application Priority Data
Jun. 13, 2006 (KR) .................. 10-2006-0053217

(51) Int. Cl.
*C23C 16/00* (2006.01)

(52) U.S. Cl.
USPC ................................. 118/726; 118/727

(58) Field of Classification Search
USPC .................................. 118/726, 727
See application file for complete search history.

(56) References Cited

U.S. PATENT DOCUMENTS

| 4,188,194 | A | * | 2/1980 | Corrigan | 51/307 |
| 4,540,878 | A | * | 9/1985 | Sato | 219/545 |
| 5,544,195 | A | | 8/1996 | Hardt et al. | |
| 5,667,712 | A | * | 9/1997 | Sutorius et al. | 219/535 |
| 6,991,948 | B2 | * | 1/2006 | Hillard | 438/17 |
| 2004/0238526 | A1 | * | 12/2004 | Leycuras | 219/548 |
| 2004/0250747 | A1 | * | 12/2004 | Sasaki et al. | 117/2 |
| 2005/0156613 | A1 | * | 7/2005 | Hosaka | 324/754 |

FOREIGN PATENT DOCUMENTS

| JP | 2005-82833 | | 3/2005 |
| KR | 2000-0054684 | * | 9/2000 |
| KR | 1020020021937 A | | 3/2002 |
| KR | 10-2003-0041646 | | 5/2003 |
| KR | 10-2003-0075462 | | 9/2003 |
| KR | 10-2006-0012718 | | 2/2006 |

OTHER PUBLICATIONS

English translation of JP 2005-082833, Ishida, Mar. 2005.*
English translation of KR 2006-0012718, Kim, Feb. 2006.*
English translation of KR 2000-0054684, Sep. 2000, Kim et al.*

(Continued)

*Primary Examiner* — Keath Chen
(74) *Attorney, Agent, or Firm* — Robert E. Bushnell, Esq.

(57) ABSTRACT

In an evaporation source, a separable heater is used when an organic thin film is formed on a substrate in order to realize full-colors so that it is possible to correspond to crucibles of various capacities. The evaporation source comprises a crucible in which an organic material which is an organic thin film material is accommodated, and the crucible includes a heating unit and at least one spray nozzle for spraying the organic material onto a substrate. In the heating unit, a heater divided into at least two parts is provided on the external surface of the crucible at uniform intervals, and the heaters are separately disposed with respect to each other, but are connected to each other by connecting members. Therefore, it is not necessary to perform an additional design whenever the capacity of the crucible is changed, it is not necessary to exchange the evaporation source, and it is possible to reduce cost and to improve repairing ability.

7 Claims, 3 Drawing Sheets

(56) References Cited

OTHER PUBLICATIONS

*Notice of Allowance* from the Korean Intellectual Property Office issued in Applicant's corresponding Korean Patent Application No. 10-2006-0053217 dated Jan. 4, 2008.

Korean Office Action issued on Jun. 7, 2007, corresponding to Korean Patent Application No. 10-2006-0053217.

Taiwanese Office Action issued by Taiwanese Patent Office, dated Apr. 22, 2011, corresponding to Taiwanese Patent Application No. 96116063, together with Request for Entry.

* cited by examiner

US 8,574,367 B2

EVAPORATION SOURCE

CLAIM OF PRIORITY

This application makes reference to, incorporates the same herein, and claims all benefits accruing under U.S.C. §119 from an application for EVAPORATION SOURCE earlier filed in the Korean Intellectual Priority Office on the 13 Jun. 2006 and there duly assigned Serial No. 10-2006-0053217.

BACKGROUND OF THE INVENTION

1. Technical Field

The present invention relates to an evaporation source and, more particularly, to an evaporation source in which a separable heater is used when an organic thin film is formed on a substrate in order to realize full-colors so that it is possible to correspond to crucibles of various capacities, and so that it is not necessary to perform an additional design whenever the capacity of the crucible is changed.

2. Related Art

An organic light emitting display is an emissive display in which electrons and holes injected into an emission layer through a cathode and an anode are re-combined with each other to form exitons so that light of a specific wavelength is generated by energy from the formed exitons. The organic light emitting display can be driven by a low voltage, is thin and light, and has a wide view angle and high response speed.

A physical vapor deposition (PVD) method, such as a vacuum deposition method, an ion plating method, a sputtering method, and a chemical vapor deposition (CVD) method by gas reaction, are commonly used for forming the thin film on the substrate of the organic light emitting display.

Among the above methods, in the vacuum deposition method by which the thin film is most commonly formed, an evaporation source is provided under the thin film, and a film forming substrate is provided on the thin film so as to form the thin film. The structure of the apparatus for depositing the thin film using the vacuum deposition method will be schematically described. A vacuum air discharging system connected to a vacuum chamber is provided. After maintaining the interior of the vacuum chamber in a vacuous state using the vacuum air discharging system, an organic material which is an organic thin film material is evaporated from the evaporation source provided under the vacuum chamber so as to include at least one organic thin film material.

In the evaporation source having the above-described structure, since the heating unit is integrally provided in accordance with the capacity of the crucible, it is necessary to additionally manufacture the heating unit in accordance with the capacity of the crucible so that the cost is increased.

SUMMARY OF THE INVENTION

Accordingly, it is an object of the present invention to provide an evaporation source in which a separable heater is used when an organic thin film is formed on a substrate in order to realize full-colors, thereby making it possible to correspond to crucibles of various capacities.

In order to achieve the foregoing and/or other objects of the present invention, according to the present invention, there is provided an evaporation source which comprises a crucible in which an organic material which is an organic thin film material is accommodated, and which includes a heating unit and at least one spray nozzle for spraying the organic material onto a substrate. In the heating unit, a heater divided into at least two parts is provided on the external surface of the crucible at uniform intervals, and the heaters are separated from each other but are connected to each other by connecting members.

The heater is preferably formed of a pipe which is curved up and down several times. The connecting members have elasticity, and are formed of the same material as the heater. The crucible is formed of a ceramic having high heat conduction, Ti, or stainless steel. The ceramic having high heat conduction is graphite, SiC, AlN, $Al_2O_3$, BN, or quartz. The heater is a ceramic heater, a Ta heater, or a W heater.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
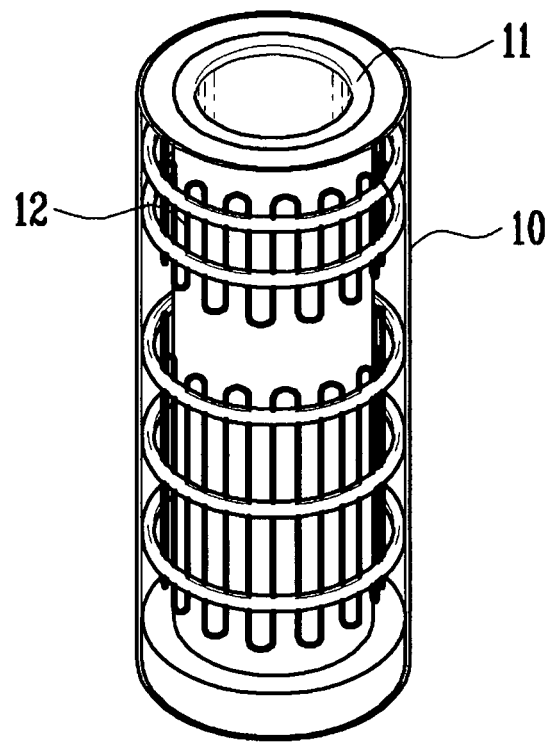
FIG. 1A is a schematic perspective view of an evaporation source.
Figure 1B:
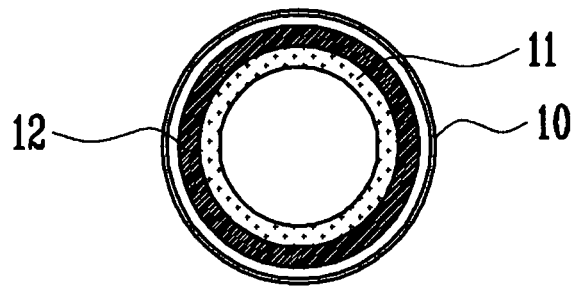
FIG. 1B is a schematic plan view of the evaporation source.

FIG. 1A is a schematic perspective view of an evaporation source, and FIG. 1B is a schematic plan view of the evaporation source.

As illustrated in FIGS. 1A and 1B, in the evaporation source, a crucible 11 in which an organic material which is an organic thin film material is accommodated, and a heating unit 12 wound around the crucible 11 so as to heat the crucible 11, are provided. The heating unit 12 has a size which varies with the capacity of the crucible 11, and is integrally formed on the external surface of the crucible 11. When the crucible 11 is heated by the heating unit 12 of the evaporation source, an organic material is evaporated and is deposited on a substrate.

Although not shown, in order to prevent the heat generated by the heating unit 12 from being radiated onto the substrate, an insulating plate is provided on the outer circumference of the heating unit 12, and a spray nozzle which is a channel through which the organic material is discharged is formed in the crucible 11.

Figure 2:
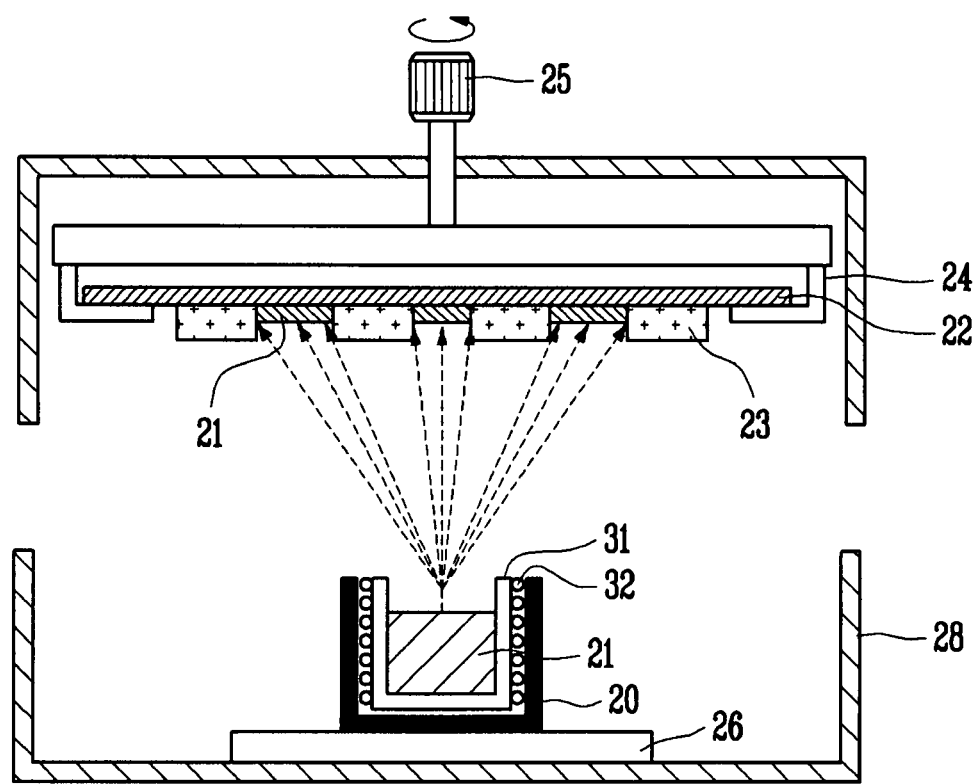
FIG. 2 is a sectional view of a thin film depositing apparatus according to the present invention.

FIG. 2 is a sectional view of a thin film depositing apparatus according to the present invention.

As illustrated in FIG. 2, the thin film depositing apparatus according to the present invention includes a vacuum chamber 28 having an interior which remains vacuous, a substrate 22 on which a deposition material 21 is to be deposited in the vacuum chamber 28, a mask 23 provided with a deposition pattern, and a mask holder 24 supporting the mask 23 and provided with apertures of a size that at least coincides with the size of apertures of the mask 23.

A substrate rotating unit 25 for rotating the substrate 22, and an evaporation source 20 facing the substrate 22 and the mask 23 so as to accommodate and heat the deposition material 21 and to evaporate the heated deposition material 21, are provided. The evaporation source 20 is eccentric with respect to the rotation axis of the substrate 22 in order to improve the uniformity of the thin film deposited on the substrate 22, and is provided on an additional mounting table 26. The mask 23 is provided between the substrate 22 and the evaporation source 20 so as to deposit the deposition material 21 on the substrate 22 in accordance with the pattern formed in the mask 23.

The evaporation source 20 is formed of stainless steel (SUS) or aluminum (Al) and, in general, a crucible made of a metal or a conductive ceramic material is heated by an electronic beam or by resistance heating so that the deposition material 21 accommodated in the crucible is evaporated or sublimated so as to be sprayed through a spray nozzle (not shown) formed above the crucible.

According to the present invention, the evaporation source 20 includes a crucible 31 in which the deposition material 21 is accommodated and a heating unit 32 for heating the deposition material 21. Also, an insulating plate is provided outside the crucible 31 so that the heat generated by the crucible 31 does not affect the deposition material 21.

In the heating unit 32, a heater separated into at least two parts is formed on the external surface of the crucible 31 at uniform intervals. The separated heater parts are connected to each other by an elastic connecting member and the heater is formed of a pipe which is curved up and down several times. The connecting member is formed of the same material as the heater.

Although not shown, a deposition ratio measuring monitor (not shown) for monitoring a deposition thickness is provided in a region of the evaporation source 20. For example, when the aperture ratio of a sub pixel is 50%, a deposition material having a thickness twice the thickness calculated by the deposition ratio measuring monitor is deposited in the sub pixel.

The deposition ratio measuring monitor is integrated with the evaporation source 20 so as to maintain an expected evaporation ratio. A deposition ratio is controlled in real time while observing the degree of deposition of the deposition material and moving together with the evaporation source 20. It is determined whether the entire deposition ratio generated by the heating unit of the evaporation source 20 is suitable for a film forming process so that the deposition ratio is controlled.

In the evaporation source 20 which operates in a vertical direction, in order to control the degree of formation of a film on the substrate 22, the amount of heat generated by the heating unit 32 of the evaporation source 20 is controlled so as to control the amount of the gasified or sublimated deposition material 21. Also, the speed of movement of the evaporation source 20 is controlled with respect to the amount of the gasified or sublimated identical deposition material 21 so that the time during which the substrate 22 is exposed to the evaporation source 20 is controlled so as to control the deposition ratio.

A method of depositing a thin film on the substrate 22 using the thin film depositing apparatus according to the present invention will be described. The deposition material 21 is accommodated in the vacuum chamber 28 and the evaporation source 20, including heating unit 32, is provided. The heating unit 32 is provided with at least one heater (not shown) for heating the evaporation source 20. The heater is a ceramic heater, a Ta heater, or a W heater.

The substrate 22 and the mask 23 are positioned in the mask holder 24 so as to face the evaporation source 20, and the deposition material 21 is deposited on the substrate 22 while moving the evaporation source 20. In the film forming process of depositing the deposition material 21 on the substrate 22, the deposition ratio is controlled in real time while observing the degree of evaporation of the deposition material 21 using the deposition ratio measuring monitor and moving together with the evaporation source 20.

In the state where the substrate 22 is mounted in the vacuum chamber 28, the deposition material 21 heated by the heating unit 32 so as to be gasified or sublimated is sprayed onto the substrate 22 so as to be deposited on the substrate 22. The deposition material 21 can be heated so as to be gasified or sublimated, and so as to be directly deposited on the substrate 22 because the organic material, which is the deposition material 21 which is used for an organic light emitting diode (OLED), has high sublimation and is gasified at a low temperature between 200° C. and 400° C. The deposition material 21, gasified or sublimated by the evaporation source 20, is moved to the substrate 22, and undergoes continuous processes such as adsorption, deposition, and re-evaporation so as to be solidified and to form a thin film on the substrate 22.

Figure 3A:
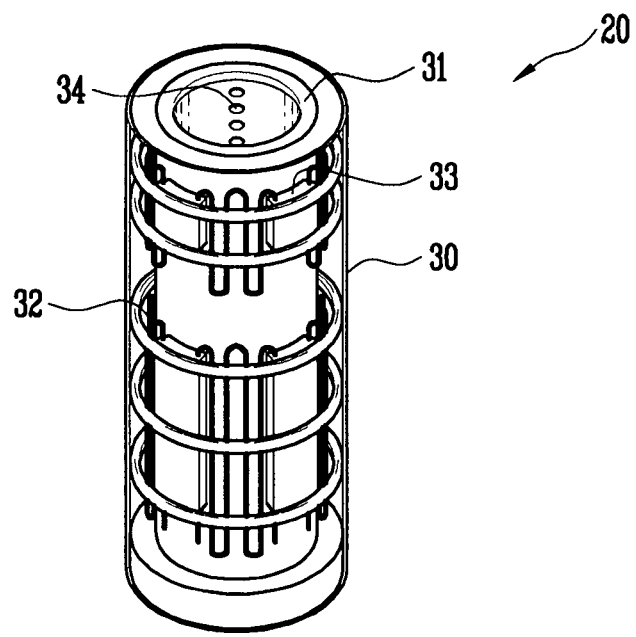
FIG. 3A is a schematic perspective view of an evaporation source according to the present invention.

FIG. 3A is a schematic perspective view of an evaporation source according to the present invention.

As illustrated in FIG. 3A, the evaporation source according to the present invention includes a crucible 31 in which a deposition material is accommodated, and a heating unit 32 for heating the crucible 31. At least one spray nozzle 34 for spraying the gasified or sublimated deposition material is provided. A reflector (not shown) is provided between the heating unit 32 and a housing 30 which surrounds the exterior of the crucible 31.

The crucible 31 accommodates a deposition material to be deposited on the substrate, and is formed of a material having high heat conduction considering the characteristic of the deposition material and an oxidation characteristic. The material is a ceramic having high heat conduction, such as graphite, SiC, AlN, $Al_2O_3$, BN, or quartz, or a metal such as Ti or stainless steel.

The heating unit 32 includes at least one heater provided to heat the crucible 31. As the heater is heated, the crucible 31 is also heated so that the deposition material starts to be evaporated at a uniform temperature.

The reflector is provided between the heating unit 32 and the housing 30, is preferably plural in number, and is provided close to the heating unit 32 so as to reflect the high temperature heat emitted from the heating unit 32 and the crucible 31. The reflector surrounds the heating unit 32 so as to prevent the heat of the heating unit 32 and the crucible 31 from leaking to the outside. The housing 30 has a double wall structure in which the wall is divided into an internal wall and an external wall so as to form a space into which cooling water is received and from which the cooling water is discharged.

Figure 3B:
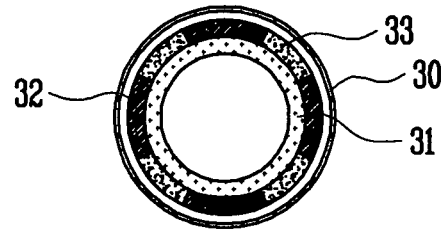
FIG. 3B is a schematic plan view of an evaporation source having a crucible of a small capacity according to the present invention.
Figure 3C:
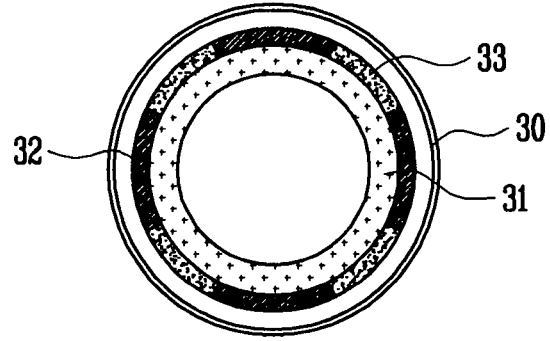
FIG. 3C is a schematic plan view of an evaporation source having a crucible of a large capacity according to the present invention.

FIG. 3B is a schematic plan view of an evaporation source having a crucible of a small capacity according to the present invention. FIG. 3C is a schematic plan view illustrating an evaporation source having a crucible of a large capacity according to the present invention.

Referring to FIGS. 3B and 3C, the heating units 32 are provided back and forth and from side to side in the crucible 31 which is provided inside the housing 30. The heating units 32 are connected to each other by elastic connecting members 33. The connecting members 33 formed on the external surface of the crucible 31 having a small capacity are not extended, while the connecting members 33 formed on the external surface of the crucible 31 having a large capacity are extended on the external surface of the crucible 31 by elasticity.

Therefore, in the evaporation source according to the present invention, the separable heater is used to correspond to crucibles of various capacities so that it is not necessary to perform an additional design whenever the capacity of the crucible is changed, and so that it is not necessary to exchange the evaporation source.

In the above-described embodiment, the heater of the heating unit is divided into four parts but it may be divided into a plurality of heaters so as to easily heat the crucibles of various capacities.

As described above, according to the present invention, the separable heater is used when the organic thin film is formed on the substrate in order to realize full-colors so that it is possible to correspond to the crucibles of various capacities, so that it is not necessary to perform an additional design whenever the capacity of the crucible is changed, so that it is not necessary to exchange the evaporation source, and so that it is possible to reduce cost and to improve repairing ability.

Although the preferred embodiments of the present invention have been disclosed for illustrative purposes, those skilled in the art will appreciate that various modifications, additions and substitutions are possible without departing from the scope and spirit of the invention as disclosed in the accompanying claims.

What is claimed is:

1. An evaporation source comprising a crucible in which an organic material which is an organic thin film material is accommodated, said crucible including a heating unit and at least one spray nozzle for spraying the organic material onto a substrate;

wherein the heating unit is divided into at least two heaters provided in parallel and at a same vertical level on an external surface of said crucible at uniform intervals, said at least two heaters being separated from each other and being connected to each other by connecting members having elasticity; and wherein the connecting members are disposed between, and at the same vertical level as, said at least two heaters, and the connecting members surround the crucible so that connecting members formed on the external surface of a crucible having a small capacity are not extended and connecting members formed on the external surface of a crucible having a large capacity are extended by the elasticity.

2. The evaporation source of claim 1, wherein said at least two heaters are formed of a pipe which is curved up and down several times.

3. The evaporation source of claim 1, wherein the connecting members are formed of a same material as said at least two heaters.

4. The evaporation source of claim 1, wherein the crucible is formed of one material selected from a group consisting of ceramic having high heat conduction, Ti, and stainless steel.

5. The evaporation source of claim 4, wherein the ceramic having high heat conduction is a material selected from a group consisting of graphite, SiC, AlN, $Al_2O_3$, and quartz.

6. The evaporation source of claim 1, wherein said at least two heaters are one of a ceramic heater and a W heater.

7. The evaporation source of claim 1, wherein the connecting members comprise arc-shaped box-like elements.

* * * * *